United States Patent
Xu et al.

(10) Patent No.: US 10,747,979 B2
(45) Date of Patent: Aug. 18, 2020

(54) OPTICAL FINGERPRINT IDENTIFICATION DEVICE, FINGERPRINT IDENTIFICATION METHOD THEREOF AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Yuanjie Xu, Beijing (CN); Weiyun Huang, Beijing (CN); Shan Gao, Beijing (CN); Yang Wang, Beijing (CN); Tingliang Liu, Beijing (CN); Pengcheng Zang, Beijing (CN); Zhonglin Cao, Beijing (CN); Ting Li, Beijing (CN); Yancheng Lu, Beijing (CN)

(73) Assignees: BOE TECHNOLOGY GROUP, CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 259 days.

(21) Appl. No.: 15/940,243

(22) Filed: Mar. 29, 2018

(65) Prior Publication Data
US 2019/0012510 A1    Jan. 10, 2019

(30) Foreign Application Priority Data

Jul. 4, 2017    (CN) .......................... 2017 1 0538450

(51) Int. Cl.
*G06K 9/00*    (2006.01)
*H01L 27/20*    (2006.01)
(Continued)

(52) U.S. Cl.
CPC .............. *G06K 9/0004* (2013.01); *G01L 1/24* (2013.01); *G06K 9/001* (2013.01); *G06K 9/0008* (2013.01);
(Continued)

(58) Field of Classification Search
CPC .... G06K 9/0004; G06K 9/001; G06K 9/0008; G06K 9/00087; G01L 1/24; H01L 41/113; H01L 27/20; H01L 41/193; H01L 41/183
See application file for complete search history.

(56) References Cited

U.S. PATENT DOCUMENTS

2015/0294099 A1* 10/2015 Frye ........................ G06F 21/32
                                                        340/5.83
2017/0300738 A1    10/2017 Li et al.
(Continued)

FOREIGN PATENT DOCUMENTS

CN    105677197 A    6/2016
CN    105824547 A    8/2016
(Continued)

OTHER PUBLICATIONS

First Office Action issued in Chinese Patent Application No. 201710538450.X, dated Jun. 14, 2019; with English translation.

*Primary Examiner* — Wesley J Tucker
(74) *Attorney, Agent, or Firm* — McDermott Will & Emery LLP

(57) ABSTRACT

An optical fingerprint identification device includes a cover plate, a piezoluminescent layer, an optical sensing layer and a patterned light shield layer. The piezoluminescent layer is arranged under the cover plate, and has a changed state of light emission when subjected to a pressure, to emit light of a certain wavelength. The optical sensing layer is configured to detect the light reflected by a finger. The patterned light shield layer is arranged between the optical sensing layer (Continued)

and the piezoluminescent layer, and is configured to block the light from directly going into the optical sensing layer.

15 Claims, 5 Drawing Sheets

(51) Int. Cl.
    *H01L 41/113*     (2006.01)
    *G01L 1/24*     (2006.01)
    *H01L 41/18*     (2006.01)
    *H01L 41/193*     (2006.01)

(52) U.S. Cl.
    CPC .......... *G06K 9/00087* (2013.01); *H01L 27/20* (2013.01); *H01L 41/113* (2013.01); *H01L 41/183* (2013.01); *H01L 41/193* (2013.01)

(56) References Cited

U.S. PATENT DOCUMENTS

| | | | |
|---|---|---|---|
| 2018/0081442 A1* | 3/2018 | Xu | G06F 3/016 |
| 2018/0173926 A1* | 6/2018 | Wang | G06K 9/6202 |
| 2019/0065811 A1* | 2/2019 | Cao | G06K 9/0004 |
| 2019/0180074 A1* | 6/2019 | Ding | G01L 1/2293 |

FOREIGN PATENT DOCUMENTS

| | | |
|---|---|---|
| CN | 106022292 A | 10/2016 |
| CN | 106383610 A | 2/2017 |
| CN | 106462285 A | 2/2017 |
| CN | 106650585 A | 5/2017 |
| CN | 106778459 A | 5/2017 |
| CN | 106778674 A | 5/2017 |

\* cited by examiner

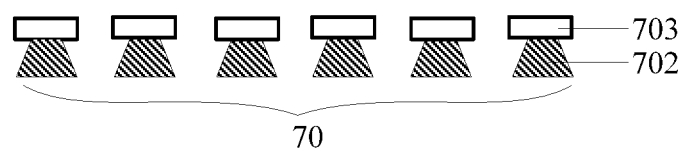
Fig. 8 (b)
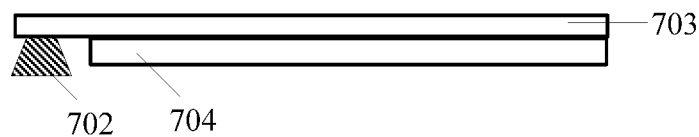
Fig. 8 (c)
| The optical sensing layer detects an intensity of the light emitted from the piezoluminescent layer, passing through the cover plate and reflected by the finger | — S100 |
| --- | --- |
| The fingerprint information is obtained according to the intensity of the light detected by the optical sensing layer | — S101 |
Fig. 9

OPTICAL FINGERPRINT IDENTIFICATION DEVICE, FINGERPRINT IDENTIFICATION METHOD THEREOF AND DISPLAY DEVICE

CROSS-REFERENCE TO RELATED APPLICATION

This application claims priority to Chinese Patent Application No. 201710538450.X, filed on Jul. 4, 2017, titled "OPTICAL FINGERPRINT IDENTIFICATION DEVICE, FINGERPRINT IDENTIFICATION METHOD THEREOF AND DISPLAY DEVICE", which is incorporated herein by reference in its entirety.

TECHNICAL FIELD

The present disclosure relates to the technical field of fingerprint identification, and more particularly, to an optical fingerprint identification device, a fingerprint identification method thereof and a display device.

BACKGROUND

In recent years, with the rapid development of the display technology, terminal devices with biometric identification functions have gradually become a necessity in life. Fingerprint recognition is widely used in various terminal devices by virtue of its unique identity characteristic, to improve user security.

SUMMARY

According to some embodiments of the present disclosure, an optical fingerprint identification device is provided. The optical fingerprint identification device includes: a cover plate; a piezoluminescent layer arranged under the cover plate, wherein the piezoluminescent layer has a changed state of light emission when subjected to a pressure, to emit light of a certain wavelength; an optical sensing layer configured to detect the light emitted from the piezoluminescent layer and reflected by a finger; and a patterned light shield layer arranged between the optical sensing layer and the piezoluminescent layer, and configured to block the light emitted from the piezoluminescent layer from directly going into the optical sensing layer.

In some embodiments of the present disclosure, the optical sensing layer is arranged between the cover plate and the patterned light shield layer. The optical sensing layer includes a plurality of photosensitive elements arranged at intervals, and an orthographic projection of the patterned light shield layer on the cover plate completely covers orthographic projections of the photosensitive elements on the cover plate.

In some embodiments of the present disclosure, the piezoluminescent layer is an entire layer which covers a fingerprint recognition area.

In some embodiments of the present disclosure, the piezoluminescent layer includes a plurality of piezoluminescent units, and an orthographic projection of each of the plurality of piezoluminescent units on the patterned light shield layer is located in a corresponding hollow region of the patterned light shield layer.

In some embodiments of the present disclosure, the optical fingerprint identification device further includes a transparent substrate, and the patterned light shield layer and the optical sensing layer are arranged on both opposite sides of the transparent substrate.

In some embodiments of the present disclosure, the piezoluminescent layer is arranged between the cover plate and the patterned light shield layer. The piezoluminescent layer includes a plurality of piezoluminescent units arranged at intervals. The patterned light shield layer covers other surfaces of each of the plurality of piezoluminescent units except a surface adjacent to the cover plate.

In some embodiments of the present disclosure, the optical sensing layer is an entire layer which covers a fingerprint recognition area.

In some embodiments of the present disclosure, the piezoluminescent layer emits no light when a pressure subjected by the piezoluminescent layer is less than a threshold value, and emits light when the pressure is greater than the threshold value.

In some embodiments of the present disclosure, the piezoluminescent layer is a piezoluminescence discoloration layer, which emits light in one color when a pressure subjected by the piezoluminescence discoloration layer is less than a threshold value, and emits light in another color when the pressure is larger than the threshold value.

In some embodiments of the present disclosure, the piezoluminescent layer is a piezoluminescence discoloration layer, and the piezoluminescence discoloration layer is made of a material selected from a group consisting of a divinyl anthracene PAIE compound, a tetrastyrene PAIE compound, a dicyano compound and a Hydroxy-substituted tetraphenyl butadiene PAIE compound.

In some embodiments of the present disclosure, the piezoluminescent layer is a piezoluminescence discoloration layer. The optical sensing layer is configured to detect a wavelength and an intensity of the light emitted from the piezoluminescent layer and reflected by the finger. The optical fingerprint identification device further includes a processor. The processor is connected to the optical sensing layer, and is configured to: obtain fingerprint information according to the intensity of the light detected by the optical sensing layer; compare the fingerprint information with predetermined fingerprint information; and control the optical fingerprint identification device to perform an operation corresponding to the wavelength detected by the optical sensing layer if the fingerprint information is consistent with the predetermined fingerprint information.

In some embodiments of the present disclosure, the piezoluminescent layer includes a plurality of light emitting sub-units, and the optical fingerprint identification device further includes one compression part arranged on the plurality of light emitting sub-units.

In some embodiments of the present disclosure, the piezoluminescent layer includes a plurality of light emitting sub-units, and the optical fingerprint identification device further includes a compression part arranged on each of the plurality of light emitting sub-units.

In some embodiments of the present disclosure, the piezoluminescent layer includes at least one light emitting sub-unit, and the optical fingerprint identification device further includes a light guide plate and a compression part. The at least one light emitting sub-unit is arranged at sides of the light guide plate except a light emitting side and a side opposite to the light emitting side, and the compression part is arranged on the light emitting side of the light guide plate.

In some embodiments of the present disclosure, a top area of each of the at least one light emitting sub-unit close to the compression part is smaller than a bottom area thereof away from the compression part.

According to some embodiments of the present disclosure, a display device is provided, and the display device includes the optical fingerprint identification device described in the above embodiments.

According to some embodiments of the present disclosure, a fingerprint identification method of the optical fingerprint identification device described in the above embodiments is provided, and the fingerprint identification method includes: detecting, by the optical sensing layer, an intensity of the light emitted from the piezoluminescent layer, passing through the cover plate and reflected by the finger; and acquiring the fingerprint information according to the intensity of the light detected by the optical sensing layer.

In some embodiments of the present disclosure, the piezoluminescent layer is a piezoluminescence discoloration layer. Before the fingerprint information is obtained according to the intensity of the light detected by the optical sensing layer, the method further includes: detecting, by the optical sensing layer, the intensity of the light emitted from the piezoluminescent layer, passing through the cover plate and reflected by the finger. After the fingerprint information is obtained according to the intensity of the light detected by the optical sensing layer, the method further includes: comparing the fingerprint information with predetermined fingerprint information; and controlling the optical fingerprint identification device to perform an operation corresponding to the wavelength detected by the optical sensing layer if the fingerprint information is consistent with the predetermined fingerprint information.

BRIEF DESCRIPTION OF THE DRAWINGS

In order to describe technical solutions in embodiments of the present disclosure more clearly, the accompanying drawings to be used in the description of the embodiments will be introduced briefly. Obviously, the accompanying drawings to be described below are merely some embodiments of the present disclosure, and a person of ordinary skill in the art can obtain other drawings according to those drawings without paying any creative effort.

FIG. 3 (b) is a structural schematic diagram of an other patterned light shield layer according to some embodiments of the present disclosure;

FIG. 8 (b) is a structural schematic diagram of an other optical sensing layer according to some embodiments of the present disclosure;

FIG. 8 (c) is a structural schematic diagram of a further optical sensing layer according to some embodiments of the present disclosure; and FIG. 9 is a flowchart of a fingerprint identification method of the optical fingerprint identification device according to some embodiments of the present disclosure.

DETAILED DESCRIPTION

The technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
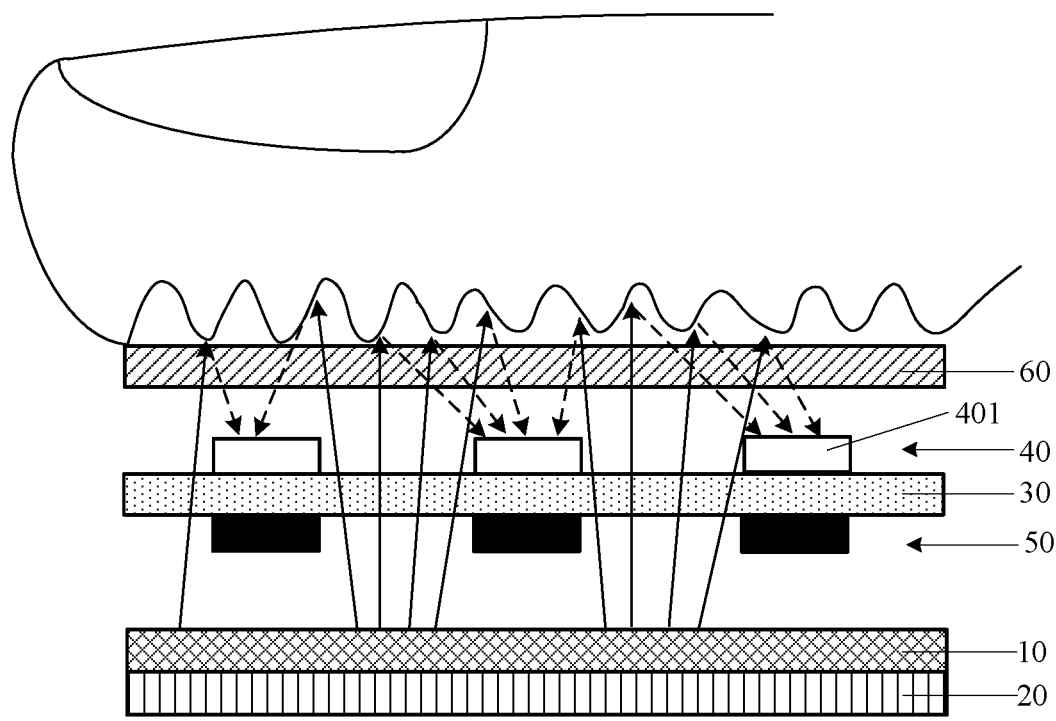
FIG. 1 is a structural schematic diagram of an optical fingerprint identification device.

The inventor has known an optical fingerprint identification device. As shown in FIG. 1, the optical fingerprint identification device includes a backlight assembly 10, a power supply 20, a transparent substrate 30 which is arranged in a light emitting direction of the backlight assembly 10, and an optical sensing layer 40 and a patterned light shield layer 50 which are arranged on both opposite sides of the transparent substrate 30. The patterned light shield layer 50 is close to the backlight assembly 10. The optical sensing layer 40 includes a plurality of photosensitive elements 401. The patterned light shield layer 50 shields the photosensitive elements 401 in a direction perpendicular to the transparent substrate 30. The optical fingerprint identification device further includes a cover plate 60 arranged over the backlight assembly 10, the transparent substrate 30, the optical sensing layer 40 and the patterned light shield layer 50. The optical fingerprint identification device emits light by the backlight assembly 10. As shown in FIG. 1, the solid line is incident light and the dashed line is reflected light. Due to the difference between ridges and valleys of a fingerprint, when the light falls on the ridges and the valleys of the fingerprint, different reflections can be created by the ridges and the valleys, and thus the photosensitive element 401 will receive different signals to determine the ridges and the valleys of the fingerprint, so as to achieve an effect of fingerprint recognition.

However, since the optical fingerprint identification device requires the backlight assembly 10 and the power supply 20 to use as a light source, and the backlight assembly 10 includes a plurality of layers, the fingerprint identification device has a thicker thickness. In addition, the power supply 20 will use power, resulting in an increase in the cost of the optical fingerprint identification device.

Figure 2:
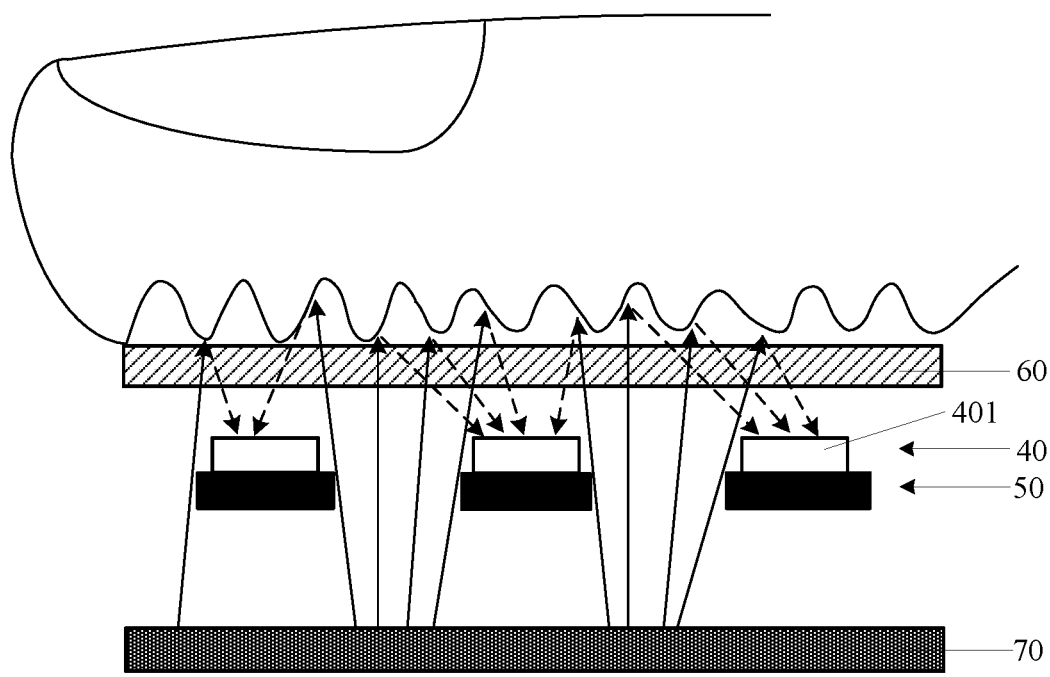
FIG. 2 is a structural schematic diagram of an optical fingerprint identification device according to some embodiments of the present disclosure.

For the above problem, some embodiments of the present disclosure provide an optical fingerprint identification device. As shown in FIG. 2, the optical fingerprint identification device includes a cover plate 60, a piezoluminescent layer 70, an optical sensing layer 40 and a patterned light shield layer 50. The piezoluminescent layer 70 is arranged under the cover plate 60, and has a changed state of light emission when subjected to a pressure, to emit light of a certain wavelength. The optical sensing layer 40 is configured to detect the light emitted from the piezoluminescent layer 70 and reflected by a finger. The patterned light shield layer 50 is arranged between the optical sensing layer 40 and the piezoluminescent layer 70, and is configured to block the light emitted from the piezoluminescent layer 70 from directly going into the optical sensing layer 40.

The principle of the optical fingerprint identification device for optically identifying a fingerprint is as follows. The light emitted from the piezoluminescent layer 70 enters outward from the optical fingerprint identification device. When a user puts his/her finger on the cover plate 60, since ridge lines and valley lines of a fingerprint of the finger are uneven, refraction angles of the light, which is emitted from the piezoluminescent layer 70, refracted by the ridges and valleys of the fingerprint will be different, and intensities of the light, which is reflected back by the ridges and valleys, will be different. Therefore, the reflected light detected by the optical sensing layer 40 will be different. After then, the optical fingerprint identification device processes the light detected by the optical sensing layer 40, so that fingerprint information can be obtained.

The cover plate 60 is made of a material which is transparent to light. For example, the material of the cover plate 60 is glass.

In some embodiments, the description that the piezoluminescent layer 70 has the changed state of light emission when subjected to a pressure means that the piezoluminescent layer 70 emits no light when it is not subjected to a pressure or is subjected to a pressure which is less than a threshold value, and emits light of a wavelength when it is subjected to a pressure which is greater than the threshold value. In some other embodiments, the piezoluminescent layer 70 is a piezoluminescence discoloration layer which emits light whether it is subjected to a pressure or not. When the piezoluminescent discoloration layer is not subjected to a pressure or is subjected to a pressure which is less than a threshold value, it emits light of a wavelength (i.e., light in one color), and when the piezoluminescent discoloration layer is subjected to a pressure which is larger than the threshold value, it emits light of another wavelength (i.e., light in another color).

In some embodiments of the present disclosure, the threshold value is a predetermined value. The threshold value of light emission (which corresponds to that no light is emitted before the piezoluminescent layer is subjected to a pressure) or the threshold value of light emission discoloration (which corresponds to that light is emitted before the piezoluminescent layer is subjected to a pressure) of the piezoluminescent layer 70 is related to the material of the piezoluminescent layer 70. The threshold value of the light emission or the threshold value of the light emission discoloration of the piezoluminescent layer 70 is different depending on the material. In some embodiments, the threshold value of the light emission or the threshold value of the light emission discoloration of the piezoluminescent layer 70 is about between 3 MPa and 30 MPa. In some embodiments, the threshold value of the light emission or the threshold value of the light emission discoloration of the piezoluminescent layer 70 is between 3 MPa and 30 MPa.

When the piezoluminescent layer is a piezoluminescence discoloration layer, the material of the piezoluminescence discoloration layer is a piezoluminescence discoloration material. The piezoluminescence discoloration material refers to a class of smart materials, the light emitting color of which changes significantly under the action of an external force (such as a pressure, a shear force or a tensile force). The reason why the light emitting color of the piezoluminescence discoloration material changes is that a crystal structure of the piezoluminescence discoloration material is damaged. For example, when a colorless polymer having a spiropyran structure is subjected to a pressure, it converts into a polymer having a merocyanine structure. In addition, the colorless polymer emits colorless light before subjected to the pressure, and emits red light after subjected to the pressure. Since there is no large steric hindrance group in the molecular structure of the piezoluminescence discoloration material, it is easy for the damaged crystal structure to recover automatically, and thus the discoloration of piezoluminescence discoloration material is reversible in a short time. On the basis of this, the color of the light emitted from the piezoluminescence discoloration layer changes when the pressure on the piezoluminescence discoloration layer is greater than a threshold value at which a change of the color of the light emitted from the piezoluminescence discoloration layer occurs, and the color of the light emitted from the piezoluminescence discoloration layer recovers to the color of that before the layer is subjected to the pressure when the pressure is less than the threshold value of piezoluminescence discoloration.

When the piezoluminescent layer 70 is a piezoluminescence discoloration layer, the material of the piezoluminescence discoloration layer is not limited. In some examples, the material of the piezoluminescence discoloration layer is a divinyl anthracene PAIE (piezfluorochromic aggregation-induced emission materials) compound, which emits green light when it is subjected to a pressure less than a threshold value of light emission discoloration, and emits red light when it is subjected to a pressure larger than the threshold value of light emission discoloration. In some other examples, the material of the piezoluminescence discoloration layer is a tetrastyrene PAIE compound, which emits blue light when it is subjected to a pressure less than a threshold value of light emission discoloration, and emits green light when it is subjected to a pressure larger than the threshold value of light emission discoloration. In some other examples, the material of the piezoluminescence discoloration layer is a dicyano compound, which emits orange light when it is subjected to a pressure less than a threshold of light emission discoloration, and emits bright-red light when it is subjected to a pressure larger than the threshold value of light emission discoloration. In some other examples, the material of the piezoluminescence discoloration layer is a Hydroxy-substituted tetraphenyl butadiene PAIE compound, which emits blue light when it is subjected to a pressure less than a threshold value of light emission discoloration, and emits yellow-green light when it is subjected to a pressure larger than the threshold value of light emission discoloration. The above-listed piezoluminescence discoloration materials are part of the compounds that fluoresce when subjected to a pressure. Of course, there are many other metal complexes that have a property of phosphorescent, which will emit light having a significant red-shift phenomenon when they are subjected to a pressure, and which will not be enumerated here one by one.

In the case that the piezoluminescent layer 70 emits no light when it is not subjected to a pressure or is subjected to a pressure less than the threshold value, and emits light when it subjected to a pressure greater than the threshold value, the material of the piezoluminescent layer 70 is, for example, a inorganic compound and complexes containing lanthanide metal ions, or kazuo phenothiazine substituted diphenyl sulfone.

In order to allow the piezoluminescent layer 70 to emit light (no light is emitted before a pressure is applied) or to enable the color of the light emitted from the piezoluminescent layer 70 (light is emitted before a pressure is applied) to be changed, a pressure on a upper surface of the cover plate 60 must be able to be transferred to the piezoluminescent layer 70. However, the pressure cannot be transferred among the cover plate 60, the piezoluminescent layer 70, the optical sensing layer 40 and the patterned light shield layer 50 through the air medium, so in some embodiments, two adjacent layers among the cover plate 60, the piezoluminescent layer 70, the optical sensing layer 40 and the patterned light shield layer 50 are arranged to contact with each other and be stacked. In some other embodiments, there is a transparent medium arranged among the cover plate 60, the piezoluminescent layer 70, the optical sensing layer 40 and the patterned light shield layer 50, to transfer the pressure on the cover plate 60 to the piezoluminescent layer 70.

In some embodiments, the optical sensing layer 40 senses the light emitted from the piezoluminescent layer 70 and reflected by the finger, and converts a light signal into an electrical signal. After then, the optical fingerprint identification device processes the electrical signal to obtain fingerprint information.

In order to ensure an accurate recognition of the fingerprint by the optical fingerprint identification device, the optical sensing layer 40 is configured to only detect the light emitted from the piezoluminescent layer 70 and reflected by the finger, and not detect the light emitted from the optical sensing layer 40 and not be reflected by the finger. For this purpose, the patterned light shield layer 50 is arranged to block the light emitted from the piezoluminescent layer 70 from directly going into the optical sensing layer 40. The direct light here refers to the light with no reflection of the finger.

Figure 3:
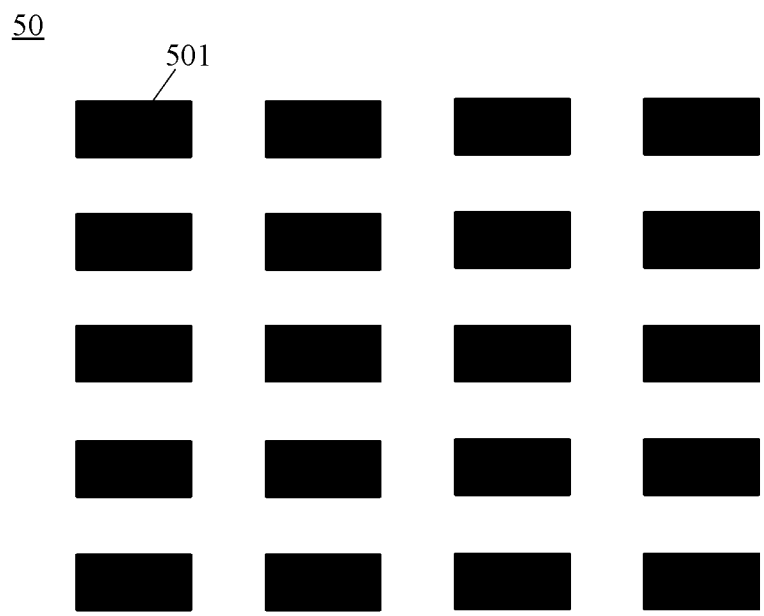
FIG. 3 (a) is a structural schematic diagram of a patterned light shield layer according to some embodiments of the present disclosure.
Figure 3:
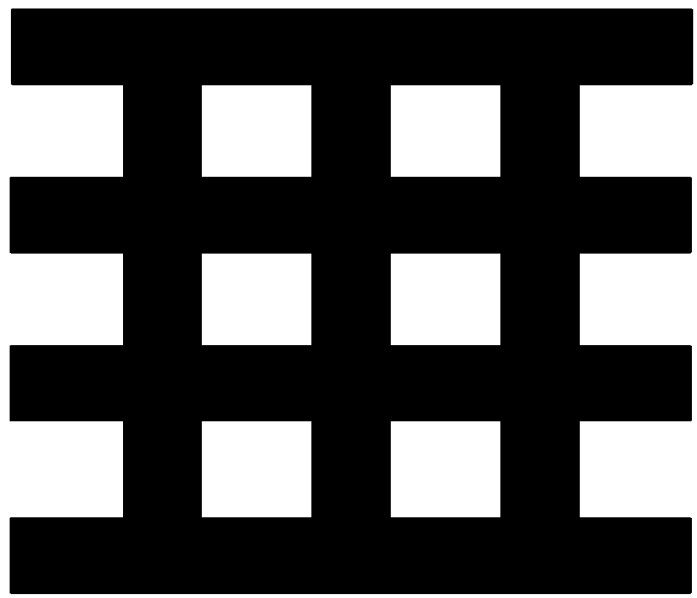

The patterned light shield layer 50 is arranged between the optical sensing layer 40 and the piezoluminescent layer 70. In order to ensure that the light emitted from the piezoluminescent layer 70 can enter out of the cover plate 60 and then be reflected onto the optical sensing layer 40, the patterned light shield layer 50 is not an entire layer and has hollow regions. In some embodiments, the patterned light shield layer 50, as shown in FIG. 3 (a), includes a plurality of light shield sub-pattern 501 arranged at intervals. In some other embodiments, as shown in FIG. 3 (b), the patterned light shield layer 50 exists as an entity.

In some embodiments, the piezoluminescent layer 70 is arranged between the cover plate 60 and the patterned light shield layer 50. In some other embodiments, the optical sensing layer 40 is arranged between the cover plate 60 and the patterned light shield layer 50.

In the optical fingerprint identification device provided by the embodiments of the present disclosure, the optical fingerprint identification device includes the piezoluminescent layer 70, and since the piezoluminescent layer 70 can emit light, the piezoluminescent layer 70 may correspond to a light source. The light emitted from the piezoluminescent layer 70 penetrates through the cover plate 60 and then is reflected by the finger to the optical sensing layer 40. The optical sensing layer 40 detects the reflected light, and then the fingerprint information can be obtained. Since the piezoluminescent layer 70 has a thinner thickness, the thickness of the optical fingerprint identification device is reduced, so that the optical fingerprint identification device becomes thinner and lighter. In addition, since the piezoluminescent layer 70 emits light or changes the color of the light emitted therefrom by being subjected to a pressure, no power consumption is needed, and thus the cost of the optical fingerprint identification device is reduced.

In some embodiments, the piezoluminescent layer 70, the patterned light shield layer 50, the optical sensing layer 40 and the cover plate 60 are fabricated on one substrate, and thus a simple structure is obtained.

In some embodiments of the present disclosure, as shown in FIG. 2, the optical sensing layer 40 is arranged between the cover plate 60 and the patterned light shield layer 50, and includes a plurality of photosensitive elements 401 arranged at intervals. An orthographic projection of the patterned light shield layer 50 on the cover plate 60 completely covers orthographic projections of the photosensitive elements 401 on the cover plate 60.

Since the optical sensing layer 40 is arranged between the cover plate 60 and the patterned light shield layer 50, and the patterned light shield layer 50 is arranged between the optical sensing layer 40 and the piezoluminescent layer 70, the piezoluminescent layer 70, the patterned light shield layer 50, the optical sensing layer 40 and the cover plate 60 are arranged to be laminated in sequence.

Since the orthographic projection of the patterned light shield layer 50 on the cover plate 60 completely covers the orthographic projections of the photosensitive elements 401 on the cover plate 60, the light emitted from the piezoluminescent layer 70 can only pass through the hollow regions of the patterned light shield layer 50, and then be reflected by the finger to the photosensitive elements 401. In turn, the photosensitive elements 401 sense the light, so that the recognition of the fingerprint can be achieved.

Figure 4:
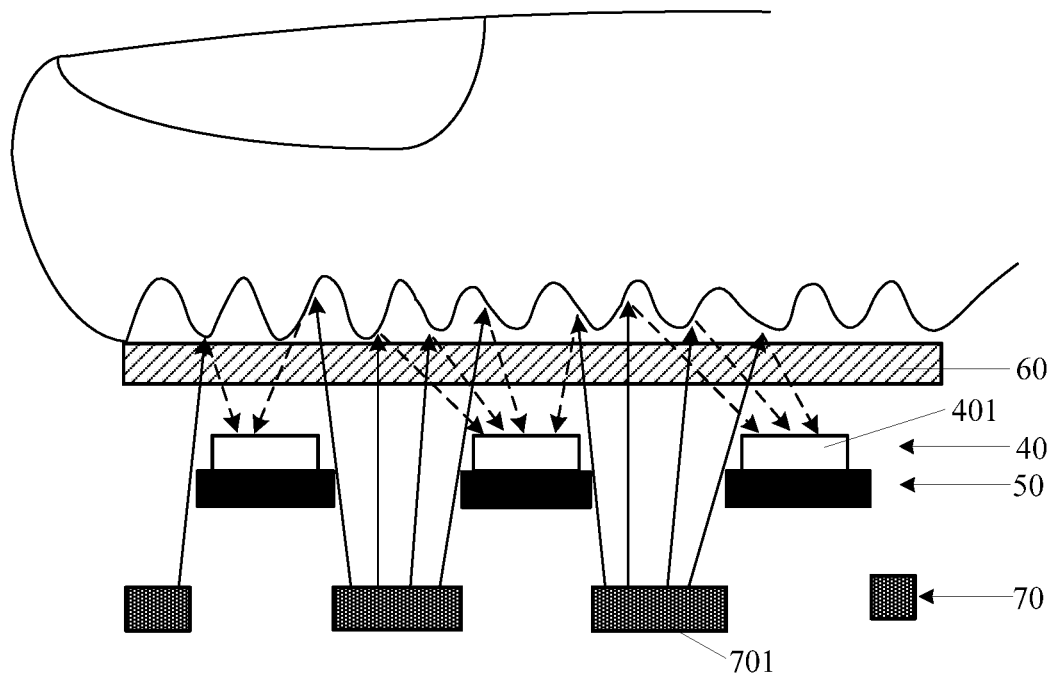
FIG. 4 is a structural schematic diagram of an other optical fingerprint identification device according to some embodiments of the present disclosure.

In some embodiments of the present disclosure, as shown in FIG. 2, the piezoluminescent layer 70 is an entire layer that covers a fingerprint recognition area. In some other embodiments of the present disclosure, as shown in FIG. 4, the piezoluminescent layer 70 includes a plurality of piezoluminescent units 701. Each of orthographic projections of the piezoluminescent units 701 on the patterned light shield layer 50 locate in a corresponding hollow region of the patterned light shield layer 50.

When the orthographic projections of the piezoluminescent units 701 on the patterned light shield layer 50 locate in the hollow regions of the patterned light shield layer 50, respectively, in some examples, boundaries of the hollow regions of the patterned light shield layer 50 coincide with boundaries of the orthographic projections of the piezoluminescent units 701 on the patterned light shield layer 50, respectively. In some other examples, the boundaries of the hollow regions of the patterned light shield layer 50 enclose the boundaries of the orthographic projections of the piezoluminescent units 701 on the patterned light shield layer 50, respectively.

In some embodiments, when the piezoluminescent layer 70 is the entire layer, no layers are arranged among the piezoluminescent layer 70, the patterned light shield layer 50, the optical sensing layer 40 and the cover plate 60, and the pressure is transferred to the piezoluminescent layer 70 sequentially through the cover plate 60, the optical sensing layer 40 and the patterned light shield layer 50, so that the piezoluminescent layer 70 emits light (no light is emitted before a pressure is applied) or changes the color of the light (light is emitted before a pressure is applied). In some other embodiments, when the piezoluminescent layer 70 includes a plurality of piezoluminescent units 701, a medium is arranged between the piezoluminescent units 701 and the cover plate 60, to transfer the pressure on the cover plate 60 to the piezoluminescent layer 70.

Figure 5:
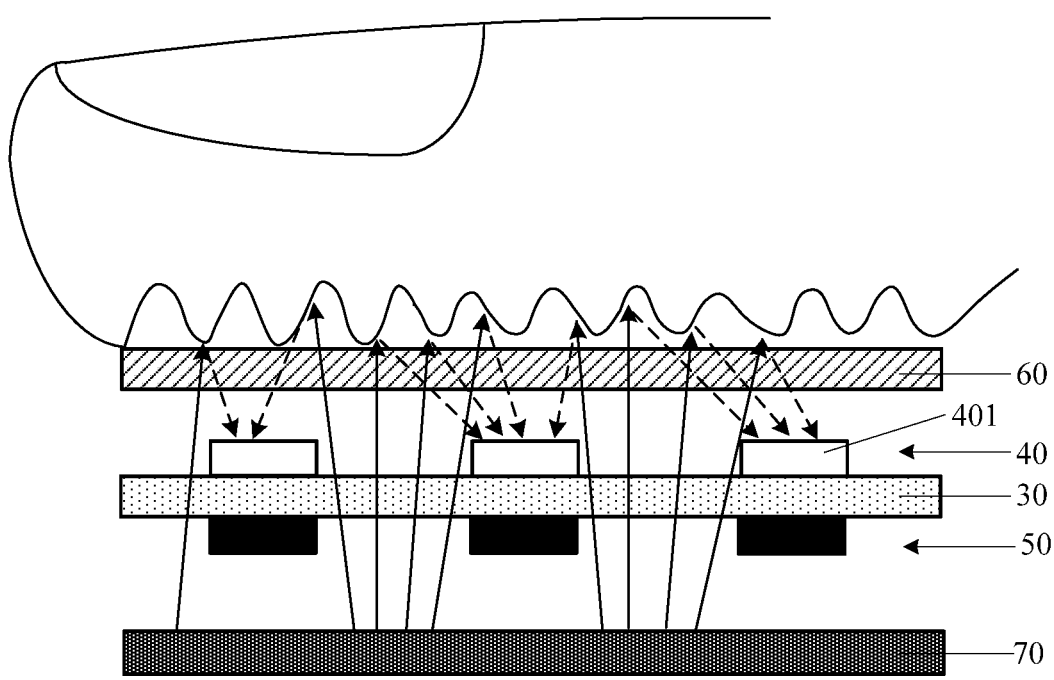
FIG. 5 is a structural schematic diagram of a further optical fingerprint identification device according to some embodiments of the present disclosure.

In some embodiments of the present disclosure, as shown in FIG. 5, the optical fingerprint identification device further includes a transparent substrate 30, and the patterned light shield layer 50 and the optical sensing layer 40 are arranged on both opposite sides of the transparent substrate 30. Relative to arranging the photosensitive elements 401 directly on the patterned light shield layer 50, arranging the photosensitive elements 401 on the transparent substrate 30 is easier to fabricate. In some examples, the patterned light shield layer 50 and the optical sensing layer 40 are formed on the opposite sides of the transparent substrate 30 firstly, and then the transparent substrate 30 formed with the patterned light shield layer 50 and the optical sensing layer 40 is arranged directly on the piezoluminescent layer 70. The material of the transparent substrate 30 is not limited. For example, the transparent substrate 30 is a glass substrate.

Figure 6:
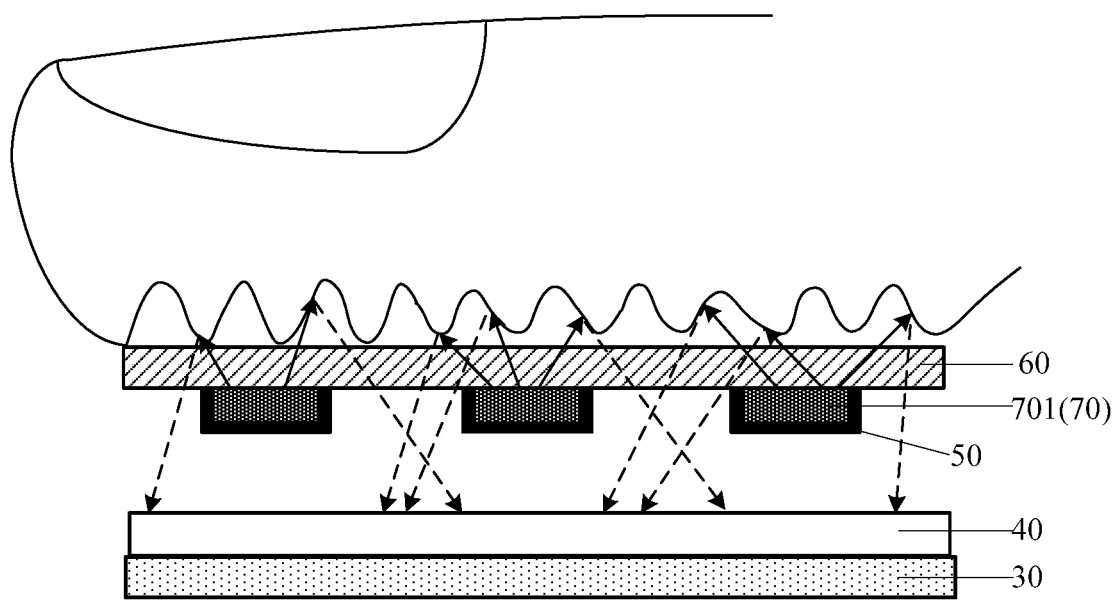
FIG. 6 is a structural schematic diagram of a yet other optical fingerprint identification device according to some embodiments of the present disclosure.

In some embodiments of the present disclosure, as shown in FIG. 6, the piezoluminescent layer 70 is arranged between the cover plate 60 and the patterned light shield layer 50. The piezoluminescent layer 70 includes a plurality of piezoluminescent units 701 arranged at intervals. The patterned light shield layer 50 covers surfaces of the piezoluminescent units 701 except surfaces thereof adjacent to the cover plate 60. Therefore, the light emitted from the piezoluminescent layer 70 can only advance towards the cover plate 60. The light emitted from the piezoluminescent layer 70 passes through the cover plate 60, is reflected by the finger to the optical sensing layer 40, and then is detected by the optical sensing layer 40, so that the recognition of the fingerprint can be achieved.

Here the piezoluminescent layer 70 is arranged between the cover plate 60 and the patterned light shield layer 50, and the patterned light shield layer 50 is arranged between the piezoluminescent layer 70 and the optical sensing layer 40, so that the optical sensing layer 40, the patterned light shield layer 50, the piezoluminescent layer 70 and the cover plate 60 are arranged to be laminated in sequence. In some examples, as shown in FIG. 6, the optical sensing layer 40, the patterned light shield layer 50, the piezoluminescent layer 70 and the cover plate 60 are sequentially arranged on a substrate. For example, as shown in FIG. 6, the substrate is a transparent substrate 30.

In some embodiments, the optical sensing layer 40 includes a plurality of photosensitive elements 401. In some other embodiments, the optical sensing layer 40 is an entire layer which covers the fingerprint identification area. In this manner, the optical sensing layer 40 has a larger area, and thus the area for receiving the light emitted from the cover plate 60 and then reflected is increased, so that the recognition effect of the fingerprint becomes more accurate.

Figure 7:
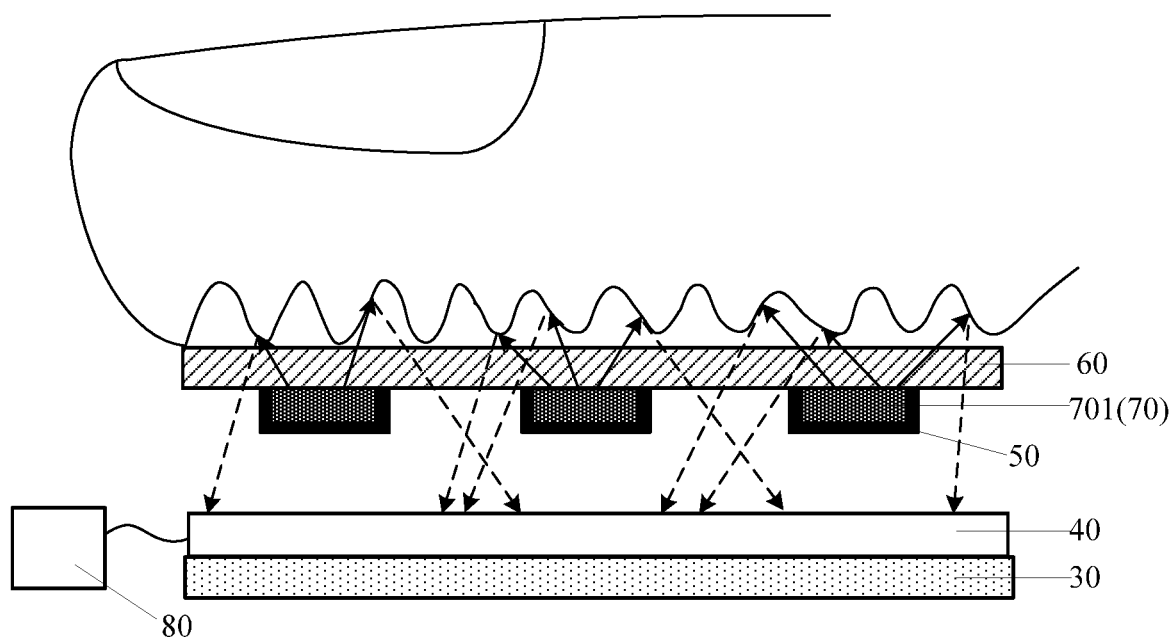
FIG. 7 is a structural schematic diagram of a yet still other optical fingerprint identification device according to some embodiments of the present disclosure.

In some embodiments of the present disclosure, as shown in FIG. 7, the piezoluminescent layer 70 is a piezoluminescence discoloration layer. The optical sensing layer 40 is configured to detect a wavelength and an intensity of the light emitted from the piezoluminescent layer 70 and reflected by the finger. The optical fingerprint identification device further includes a processor 80. The processor 80 is connected to the optical sensing layer 40, and is configured to obtain fingerprint information according to the intensity of the reflected light detected by the optical sensing layer 40, and to compare the obtained fingerprint information with predetermined fingerprint information. If the obtained fingerprint information is consistent with the predetermined fingerprint information, the processor 80 controls the optical fingerprint identification device to perform an operation corresponding to the wavelength detected by the optical sensing layer 40.

Here when the piezoluminescent layer 70 is a piezoluminescence discoloration layer, a pressure subjected by the cover plate can be transferred to the piezoluminescent layer 70, so that the color of the light, which is emitted from the piezoluminescent layer 70 after the piezoluminescent layer 70 is subjected to the pressure, can be changed.

When the piezoluminescent layer 70 is not subjected to a pressure or is subjected a pressure less than a threshold value of discoloration, it emits light in a color, and when the piezoluminescent layer 70 is subjected to a pressure greater than the threshold value of discoloration, it emits light in another color. Since the piezoluminescent layer 70 can emit light in two colors, when fingerprint recognition is performed, the piezoluminescent layer 70 can emit light in different colors in response to that the cover plate is lightly or heavily touched, and the optical sensing layer 40 achieves different functions according to the wavelength of the light sensed by its own. In some examples, when being touched lightly, the piezoluminescent layer 70 emits blue light, and then a user logs in a system or a path after a fingerprint of the user is scanned with the blue light. When being touched heavily, the piezoluminescent layer 70 emits red light, and then the user logs in another system or path after the fingerprint is scanned with the red light. In some other examples, when being touched lightly, the piezoluminescent layer 70 emits blue light, and then the optical sensing layer 40 senses that the reflected light is blue light. At this time, there is a need for the user to input a password to unlock the fingerprint after the fingerprint recognition. When being pressed heavily, the piezoluminescent layer 70 emits red light, and then the optical sensing layer 40 senses that the reflected light is red light. At this time, the user can directly unlock the optical fingerprint identification device.

It will be noted that, after the optical sensing layer 40 detects the light reflected by the finger, it converts a light signal into an electric signal. The converted electric signal includes wavelength information and intensity information as the optical signal includes wavelength information and intensity information. The optical fingerprint identification device can obtain the wavelength and intensity of the reflected light according to the electrical signal.

In some embodiments of the present disclosure, since the piezoluminescent layer 70 is a piezoluminescence discoloration layer, when the fingerprint identification is being performed, different functions can be achieved according to the different colors of the light emitted from the piezoluminescence discoloration layer. In some examples, the fingerprint identifications of the light of two wavelengths authenticate each other, which enhances the security of the fingerprint identification, and increases the accuracy of the fingerprint recognition.

Figure 8:
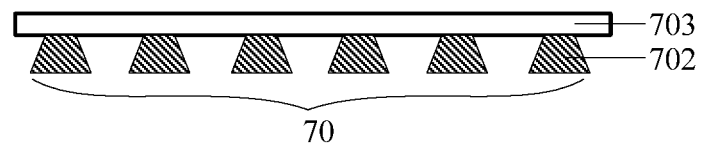
FIG. 8 (a) is a structural schematic diagram of an optical sensing layer according to some embodiments of the present disclosure.

In some embodiments of the present disclosure, as shown in FIG. 8 (a), the piezoluminescent layer 70 includes a plurality of light emitting sub-units 702, and the optical fingerprint identification device further includes one compression part 703 arranged on the plurality of light emitting sub-units 702.

In some examples, when the piezoluminescent layer 70 is an entire layer, the piezoluminescent layer 70 includes a plurality of light emitting sub-units 702. In some other examples, when the piezoluminescent layer 70 includes a plurality of piezoluminescent units 701, each of the piezoluminescent units 701 includes a plurality of light emitting sub-units 702.

It will be noted that, it is related to a pressure that the piezoluminescent layer 70 emits light (no light is emitted before a pressure is applied) or the color of the emitted light (light is emitted before a pressure is applied) changes, and when the pressure applied to the piezoluminescent layer 70 is constant, the smaller a pressed area of the piezoluminescent layer 70, the greater the pressure.

Since the piezoluminescent layer 70 includes a plurality of light emitting sub-units 702, the piezoluminescent layer 70 has a smaller pressed area, so that the pressure, which is needed by the piezoluminescent layer 70 to emit light (no light is emitted before a pressure is applied) or change the light emitting color (light is emitted before a pressure is applied), is reduced, and thus the piezoluminescent layer 70 can emit light or change the light emitting color with a smaller force.

In some embodiments of the present disclosure, as shown in FIG. 8 (b), the piezoluminescent layer 70 includes a plurality of light emitting sub-units 702. The optical fingerprint identification device further includes a compression part 703 arranged on each of the plurality of light emitting sub-units 702.

In some examples, when the piezoluminescent layer 70 is an entire layer, the piezoluminescent layer 70 includes a plurality of light emitting sub-units 702. In some other examples, when the piezoluminescent layer 70 includes a plurality of piezoluminescent units 701, each of the piezoluminescent units 701 include a plurality of light emitting sub-units 702.

Since each of the light emitting sub-units 702 has one compression part 703 arranged thereon, the compression parts 703 on the light emitting sub-units 702 do not affect each other. When a compression part 703 is subjected to a pressure, the pressure can be fully applied to this compression part 703, and a compression part 703 adjacent to this compression part 703 does not disperse the applied pressure. Thus, relative to arranging a compression part 703 on a plurality of light emitting sub-units 702, arranging a compression part 703 on each of the light emitting sub-unit 702 can make the piezoluminescent layer 70 emit light (no light is emitted before a pressure is applied) or change the light emitting color (light is emitted before a pressure is applied) with less pressure applied thereon.

In some embodiments of the present disclosure, as shown in FIG. 8(c), the piezoluminescent layer 70 includes at least one light emitting sub-unit 702, and the optical fingerprint identification device further includes a light guide plate 704 and a compression part 703. The light emitting sub-unit 702 is arranged at sides of the light guide plate 704 except a light emitting side and a side opposite to the light emitting side, and the compression part 703 is arranged on the light emitting side of the light guide plate 704.

The number of the light emitting sub-units 702 included in the piezoluminescent layer 70 is not limited. In some examples, the piezoluminescent layer 70 includes one light emitting sub-unit 702. In some other examples, the piezoluminescent layer 70 includes two or more light emitting sub-units 702. In addition, in some examples, the light emitting sub-units 702 are arranged at a side of the light guide plate 704 except the light emitting side and the side opposite to the light emitting side. In some other examples, the light emitting sub-units 702 are arranged at a plurality of sides of the light guide plate 704 except the light emitting side and the side opposite to the light emitting side.

Here the light emitted from the light emitting sub-units 702 goes into the light guide plate 704, and is uniformly emitted after passing through the light guide plate 704.

Since the piezoluminescent layer 70 includes at least one light emitting sub-unit 702, the piezoluminescent layer 70 has a smaller pressed area, so that the pressure, which is needed by the piezoluminescent layer 70 to emit light (no light is emitted before a pressure is applied) or change the light emitting color (light is emitted before a pressure is applied), reduces, and thus the piezoluminescent layer 70 can be made to emit light or change the light emitting color by a smaller pressure.

On the basis of the above, when the pressures applied are the same, in order to further increase the pressure subjected by the piezoluminescent layer 70, in some embodiments of the present disclosure, as shown in FIGS. 8(a), 8(b) and 8(c), a top area of the light emitting sub-unit 702 is smaller than a bottom area of that, and the top of the light emitting sub-unit 702 is close to the compression part 703.

Some embodiments of the present disclosure provide a display device, which includes the optical fingerprint identification device described in the above embodiments.

The display device provided by the embodiments of the present disclosure is a product including a display screen. For example, the display device is an electronic device, such as a display, a camera, a mobile phone, an MP4 video player, a video camera or a game console, which has a display screen.

The display device provided by the embodiments of the present disclosure includes the optical fingerprint identification device, and the optical fingerprint identification device includes the piezoluminescent layer 70. Since the piezoluminescent layer 70 can emit light, the piezoluminescent layer 70 may correspond to light source. The light emitted from the piezoluminescent layer 70 passes through the cover plate 60 and then is reflected by the finger to the optical sensing layer 40. The optical sensing layer 40 detects the reflected light, and then the fingerprint information can be obtained. Because the piezoluminescent layer 70 corresponding to the light source provided by the disclosed embodiments has a smaller thickness, the thickness of the optical fingerprint identification device is reduced, and thus the optical fingerprint identification device becomes thinner and lighter. In addition, since the piezoluminescent layer 70 of the embodiments of the present disclosure emits light or changes the light emitting color by being subjected to a pressure, no power consumption is required, thereby reducing the cost of the optical fingerprint identification device.

Some embodiments of the present disclosure provide a fingerprint identification method of the optical fingerprint identification device. As shown in FIG. 9, the fingerprint identification method includes steps 100 and 101 (S100 and S101).

In step 100 (S100), the optical sensing layer 40 detects an intensity of the light emitted from the piezoluminescent layer 70, passing through the cover plate and reflected by the finger.

It should be noted that, after the optical sensing layer 40 detects the light emitted from the piezoluminescent layer 70, passing through the cover plate 60 and reflected by the finger, it converts light signal into an electric signal. The optical signal contains intensity information, and thus the electrical signal also contains the intensity information.

In some embodiments, when the piezoluminescent layer 70 emits no light when it is not subjected to a pressure or is subjected to a pressure less than a threshold value, and emits light of one wavelength when it is subjected to a pressure greater than the threshold value. In some other embodiments, the piezoluminescent layer 70 emits light in either presence or absence of pressure. When the piezoluminescent layer 70 is not subjected to a pressure or is subjected to a pressure less than the threshold value, it emits light of one wavelength (i.e. light in one color), and when the piezoluminescent layer 70 is subjected to a pressure greater than the threshold value, it emits light of another wavelength (i.e. light in another color).

In step 101 (S101), the fingerprint information is obtained according to the intensity of the light detected by the optical sensing layer 40.

In fingerprint identification method of the optical fingerprint identification device provided by the embodiments of the present disclosure, the optical fingerprint identification device includes the piezoluminescent layer 70, and since the piezoluminescent layer 70 can emit light, the piezoluminescent layer 70 may correspond to light source. The light emitted from the piezoluminescent layer 70 passes through the cover plate 60 and then is reflected by the finger to the optical sensing layer 40. The optical sensing layer 40 detects the reflected light, and then the fingerprint information can be obtained. Because the piezoluminescent layer 70 corresponding to the light source provided by the disclosed embodiments has a smaller thickness, the thickness of the optical fingerprint identification device is reduced, and then the optical fingerprint identification device becomes thinner. In addition, since the piezoluminescent layer 70 of the embodiment of the present disclosure emits light or changes color by being pressed, no power consumption is required, thereby reducing the cost of the optical fingerprint identification device.

In some embodiments of the present disclosure, the piezoluminescent layer is a piezoluminescence discoloration layer. Before the fingerprint information is obtained according to the intensity of the reflected light detected by the optical sensing layer 40, the above method further includes step 200 (S200), that is, the optical sensing layer 40 detects the intensity of the light which is emitted from the piezoluminescent layer 70, passing through the cover plate and reflected by the finger.

In some embodiments, the optical sensing layer 40 detects both the wavelength and intensity of the light at the same time, wherein the light is emitted from the piezoluminescent layer 70, passing through the cover plate and reflected by the finger.

In some embodiments, the piezoluminescence discoloration layer emits light in different colors. When the piezoluminescent layer 70 is not subjected to a pressure or is subjected to a pressure less than the threshold value of discoloration, the piezoluminescent layer 70 emits light in one color, and when the piezoluminescent layer 70 is subjected to a pressure greater than the threshold value of discoloration, the piezoluminescent layer 70 emits light in another color. So when the fingerprint recognition is performed, the piezoluminescent layer 70 can emit light in different colors by being pressed lightly and heavily. Light in different colors corresponds to different wavelengths.

After acquiring the fingerprint information according to the intensity of the reflected light detected by the optical sensing layer 40, the above method further includes step 201 (S201), that is, the fingerprint information is compared with predetermined fingerprint information. If the obtained fingerprint information is consistent with the predetermined fingerprint information, the processor 80 controls the optical fingerprint identification device to perform an operation corresponding to the wavelength detected by the optical sensing layer 40.

In some embodiments, the piezoluminescent layer 70 can emit light of different wavelength to achieve different functions. For example, when being pressed lightly, the piezoluminescent layer 70 emits blue light, and then the optical sensing layer 40 senses that the reflected light is blue light. In this situation, there is a need for the user to input a password to unlock the fingerprint after the fingerprint recognition. When being pressed heavily, the piezoluminescent layer 70 emits red light, and then the optical sensing layer 40 senses that the reflected light is red light. In this situation, the user can directly unlock the optical fingerprint identification device.

In some embodiments of the present disclosure, when the fingerprint identification is performed, different functions can be achieved according to the light of different colors emitted from the piezoluminescence discoloration layer. In addition, in some examples, the fingerprint identifications of the light of two wavelengths authenticate each other, which enhances the security of the fingerprint identification, and increases the accuracy of the fingerprint recognition.

The above is merely the specific embodiments of the present disclosure, but the scope of the disclosure is not limited thereto. The changes and modifications that can be easily made by any person skilled in the art within the technical scope are also covered within the scope of the disclosure. Therefore, the scope of the present disclosure should be based on the scope of the claims.

What is claimed is:

1. An optical fingerprint identification device, comprising:
   a cover plate;
   a piezoluminescent layer arranged under the cover plate, wherein the piezoluminescent layer has a changed state of light emission when subjected to a pressure, to emit light of a preset wavelength;
   an optical sensing layer configured to detect the light emitted from the piezoluminescent layer and reflected by a finger; and
   a patterned light shield layer arranged between the optical sensing layer and the piezoluminescent layer, and configured to block the light emitted from the piezoluminescent layer from directly going into the optical sensing layer,
   wherein the optical sensing layer is arranged between the cover plate and the patterned light shield layer,
   the optical sensing layer comprises a plurality of photosensitive elements arranged at intervals, and an orthographic projection of the patterned light shield layer on the cover plate completely covers orthographic projections of the photosensitive elements on the cover plate, and
   wherein the piezoluminescent layer comprises a plurality of piezoluminescent units, an orthographic projection of each of the plurality of piezoluminescent units on the patterned light shield layer is located in a corresponding hollow region of the patterned light shield layer.

2. The optical fingerprint identification device according to claim 1, further comprising a transparent substrate, wherein the patterned light shield layer and the optical sensing layer are arranged on both opposite sides of the transparent substrate.

3. The optical fingerprint identification device according to claim 1, wherein the piezoluminescent layer emits no light when a pressure subjected by the piezoluminescent layer is less than a threshold value, and emits light when the pressure is greater than the threshold value.

4. The optical fingerprint identification device according to claim 1, wherein the piezoluminescent layer is a piezoluminescence discoloration layer, which emits light in one color when a pressure subjected by the piezoluminescence discoloration layer is less than a threshold value, and emits light in another color when the pressure is larger than the threshold value.

5. The optical fingerprint identification device according to claim 4, wherein the piezoluminescence discoloration layer is made of a material selected from a group consisting of a divinyl anthracene PAIE compound, a tetrastyrene PAIE compound, a dicyano compound and a Hydroxy-substituted tetraphenyl butadiene PAIE compound.

6. The optical fingerprint identification device according to claim 4, wherein the optical sensing layer is configured to detect a wavelength and an intensity of the light emitted from the piezoluminescent layer and reflected by the finger;

the optical fingerprint identification device further comprises a processor, wherein the processor is connected to the optical sensing layer, and configured to:

obtain fingerprint information according to the intensity of the light detected by the optical sensing layer;

compare the fingerprint information with predetermined fingerprint information; and control the optical fingerprint identification device to perform an operation corresponding to the wavelength detected by the optical sensing layer if the fingerprint information is consistent with the predetermined fingerprint information.

7. The optical fingerprint identification device according to claim 1, wherein the piezoluminescent layer comprises a plurality of light emitting sub-units, and the optical fingerprint identification device further comprises one compression part arranged on the plurality of light emitting sub-units.

8. The optical fingerprint identification device according to claim 1, wherein the piezoluminescent layer comprises a plurality of light emitting sub-units, and the optical fingerprint identification device further comprises a compression part arranged on each of the plurality of light emitting sub-units.

9. The optical fingerprint identification device according to claim 1, wherein the piezoluminescent layer comprises at least one light emitting sub-unit;

the optical fingerprint identification device further comprises a light guide plate and a compression part, the at least one light emitting sub-unit is arranged at sides of the light guide plate except a light emitting side and a side opposite to the light emitting side, and the compression part is arranged on the light emitting side of the light guide plate.

10. The optical fingerprint identification device according to claim 9, wherein a top area of each of the at least one light emitting sub-unit close to the compression part is smaller than a bottom area thereof away from the compression part.

11. A display device, comprising the optical fingerprint identification device according to claim 1.

12. A fingerprint identification method of the optical fingerprint identification device according to claim 1, comprising:

detecting, by the optical sensing layer, an intensity of the light emitted from the piezoluminescent layer, passing through the cover plate and reflected by the finger; and acquiring fingerprint information according to the intensity of the light detected by the optical sensing layer.

13. The fingerprint identification method according to claim 12, wherein the piezoluminescent layer is a piezoluminescence discoloration layer;

before the fingerprint information is obtained according to the intensity of the light detected by the optical sensing layer, the method further comprises:

detecting, by the optical sensing layer 40, the intensity of the light emitted from the piezoluminescent layer, passing through the cover plate and reflected by the finger; and after the fingerprint information is obtained according to the intensity of the light detected by the optical sensing layer, the method further comprises:

comparing the fingerprint information with predetermined fingerprint information; and controlling the optical fingerprint identification device to perform an operation corresponding to the wavelength detected by the optical sensing layer if the fingerprint information is consistent with the predetermined fingerprint information.

14. An optical fingerprint identification device, comprising:

a cover plate;

a piezoluminescent layer arranged under the cover plate, wherein the piezoluminescent layer has a changed state of light emission when subjected to a pressure, to emit light of a preset wavelength;

an optical sensing layer configured to detect the light emitted from the piezoluminescent layer and reflected by a finger; and a patterned light shield layer arranged between the optical sensing layer and the piezoluminescent layer, and configured to block the light emitted from the piezoluminescent layer from directly going into the optical sensing layer;

wherein the piezoluminescent layer is arranged between the cover plate and the patterned light shield layer;

the piezoluminescent layer comprises a plurality of piezoluminescent units arranged at intervals, and the patterned light shield layer covers other surfaces of each of the plurality of piezoluminescent units except a surface adjacent to the cover plate.

15. The optical fingerprint identification device according to claim 14, wherein the optical sensing layer is an entire layer which covers a fingerprint recognition area.

* * * * *